US010825694B2

(12) United States Patent
Yamaguchi et al.

(10) Patent No.: US 10,825,694 B2
(45) Date of Patent: Nov. 3, 2020

(54) METHOD FOR MANUFACTURING ELECTRONIC COMPONENT, RESIN COMPOSITION FOR TEMPORARY PROTECTION, AND RESIN FILM FOR TEMPORARY PROTECTION

(71) Applicant: HITACHI CHEMICAL COMPANY, LTD., Tokyo (JP)

(72) Inventors: Yushi Yamaguchi, Tokyo (JP); Ryoji Furutani, Tokyo (JP); Takuji Ikeya, Tokyo (JP); Shogo Sobue, Tokyo (JP); Yasuyuki Ooyama, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 16/482,857

(22) PCT Filed: Jan. 23, 2018

(86) PCT No.: PCT/JP2018/001967
§ 371 (c)(1),
(2) Date: Aug. 1, 2019

(87) PCT Pub. No.: WO2018/143014
PCT Pub. Date: Aug. 9, 2018

(65) Prior Publication Data
US 2020/0006087 A1 Jan. 2, 2020

(30) Foreign Application Priority Data

Feb. 2, 2017 (JP) .................................. 2017-017682
Mar. 17, 2017 (JP) .................................. 2017-053055

(51) Int. Cl.
*H01L 21/56* (2006.01)
*H01L 21/78* (2006.01)
(Continued)

(52) U.S. Cl.
CPC ............... *H01L 21/56* (2013.01); *C08J 5/18* (2013.01); *H01L 21/7806* (2013.01); *H01L 21/82* (2013.01); *H01L 23/552* (2013.01)

(58) Field of Classification Search
CPC .............................. H01L 21/56; H01L 23/552
See application file for complete search history.

(56) References Cited

U.S. PATENT DOCUMENTS

2006/0113701 A1* 6/2006 Rudmann ............. B29C 43/021
264/219
2007/0141330 A1* 6/2007 Morishima ......... H01L 21/6836
428/343
(Continued)

FOREIGN PATENT DOCUMENTS

| JP | H9-223761 A | 8/1997 |
|----|-------------|--------|
| JP | 3824742 B | 9/2006 |

*Primary Examiner* — Bradley Smith
*Assistant Examiner* — David J Goodwin
(74) *Attorney, Agent, or Firm* — Fitch, Even, Tabin & Flannery, LLP

(57) ABSTRACT

The present invention relates to a method for manufacturing an electronic component having an electromagnetic shield, comprising: a bonding step of bonding a temporary protective material on a workpiece with unevenness on the surface thereof; a photocuring step of curing the temporary protective material by light irradiation; a icing step of singulating the workpiece and the temporary protective material; a shielding step of forming a metal film on the portion of the singulated workpiece, the portion having no temporary protective material bonded thereon; and a peeling step of peeling the temporary protective material from the workpiece having the metal film formed, wherein the temporary protective material is formed from a resin composition for temporary protection with an elastic modulus at 25° C. of 3

(Continued)

MPa or less and an elastic modulus at 25° C. of 40 MPa or more after light irradiation with an exposure dose of 500 mJ/cm$^2$ or more.

20 Claims, 1 Drawing Sheet

(51) Int. Cl.
*C08J 5/18* (2006.01)
*H01L 21/82* (2006.01)
*H01L 23/552* (2006.01)

(56) References Cited

U.S. PATENT DOCUMENTS

| | | | | |
|---|---|---|---|---|
| 2010/0330780 | A1* | 12/2010 | Hwang | C09J 7/35 |
| | | | | 438/464 |
| 2013/0137218 | A1* | 5/2013 | Morita | C08K 5/32 |
| | | | | 438/113 |
| 2013/0300011 | A1* | 11/2013 | Fujimoto | B29C 33/424 |
| | | | | 264/2.5 |
| 2014/0363584 | A1* | 12/2014 | Suzuki | H01L 21/3086 |
| | | | | 427/510 |
| 2017/0200873 | A1* | 7/2017 | Nakabayashi | H01L 33/005 |

* cited by examiner

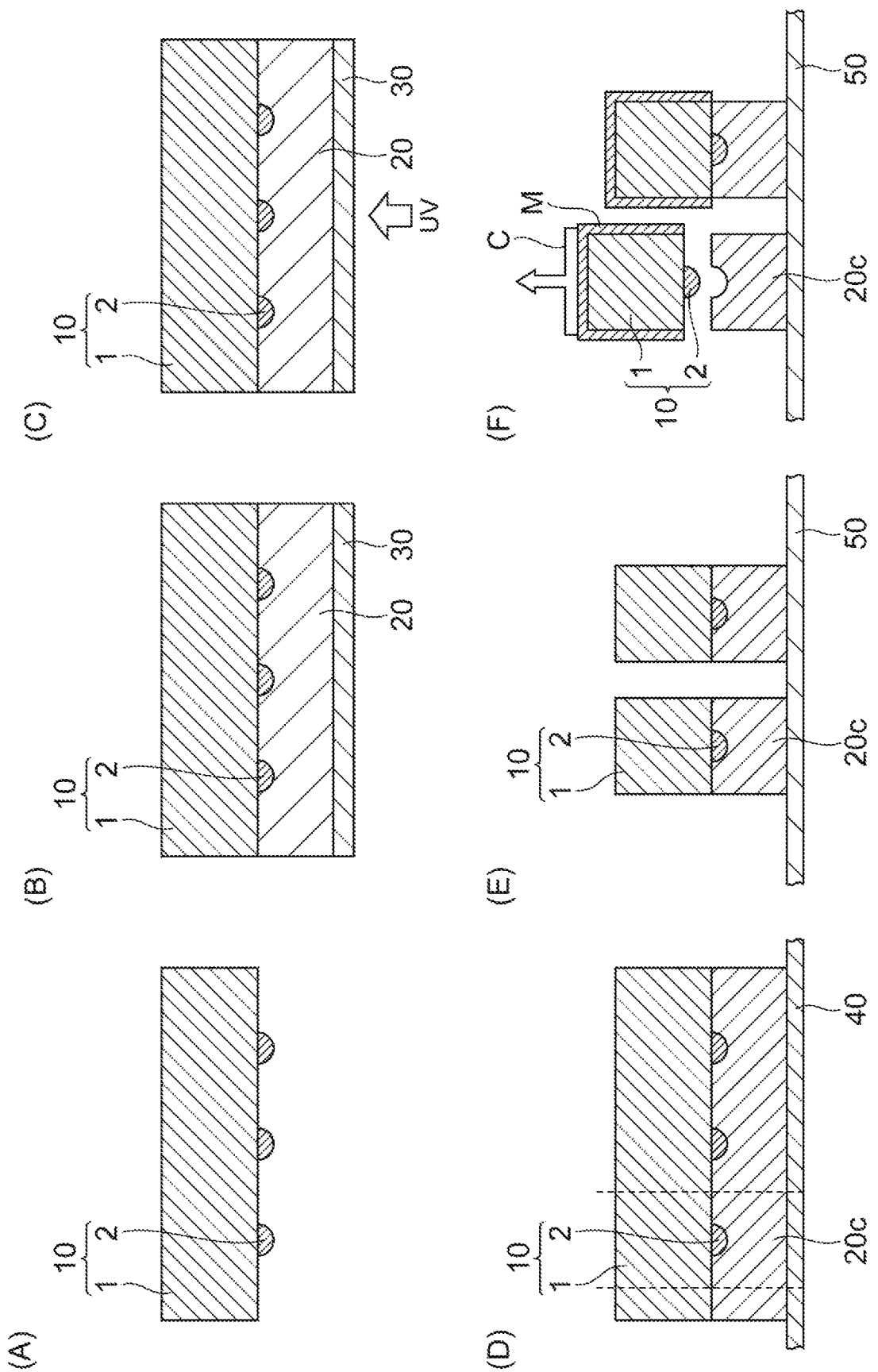

METHOD FOR MANUFACTURING ELECTRONIC COMPONENT, RESIN COMPOSITION FOR TEMPORARY PROTECTION, AND RESIN FILM FOR TEMPORARY PROTECTION

CROSS-REFERENCE TO RELATED APPLICATIONS

This application is a U.S. national phase application filed under 35 U.S.C. § 371 of International Application No. PCT/JP2018/001967, filed Jan. 23, 2018, designating the United States, which claims priority from Japanese Patent Application No. 2017-017682, filed Feb. 2, 2017, and Japanese Patent Application No. 2017-053055, filed Mar. 17, 2017, which are hereby incorporated herein by reference in their entirety.

TECHNICAL FIELD

The present invention relates to a method for manufacturing an electronic component, and a resin composition for temporary protection and a resin film for temporary protection used in the manufacturing method.

BACKGROUND ART

With the multi-functionalization and globalization of electronic devices such as smartphones and tablet PCs, the number of wireless systems mounted has been increasing. On the other hand, the clock frequency and data transmission rate of built-in circuits are increasing, and noise in the frequency band used in those wireless systems is easily generated. Conventionally, as a measure against such noise, an electromagnetic shield is used in which a circuit including a noise source is surrounded by a metal plate (see, for example, Patent Literatures 1 and 2).

CITATION LIST

Patent Literature

Patent Literature 1: Japanese Patent No. 3824742
Patent Literature 2: Japanese Patent Laid-Open No. 09-223761

SUMMARY OF INVENTION

Technical Problem

However, for the technique as described in the above Patent Literatures, too large an area is required for mounting. Therefore, depending on the circuit to be electromagnetically shielded, the height may be increased, which is a hindrance to downsizing and thinning of electronic devices.

From such a background, a new method has been proposed in which an electromagnetic shield is deposited by sputtering a metal serving as an electromagnetic shield material to a circuit including a noise source. An example of an electronic component provided with an electromagnetic shield includes a BGA (Ball Grid Array) package. In recent years, in addition to the downsizing and thinning of BGA packages and the like, the structure thereof itself has become complicated, and such an electronic component is also required to form an electromagnetic shield in the desired portion.

The present invention has been made in view of the above circumstances, and an object thereof is to provide a new method for manufacturing an electronic component having an electromagnetic shield. The present invention also provides a resin composition for temporary protection for forming a temporary protective material and a resin film for temporary protection obtained by forming the resin composition for temporary protection into a film, which are used in the manufacturing method.

Solution to Problem

In order to solve the above problem, the inventors of the present invention have reviewed the process for manufacturing an electronic component and conducted intensive investigations on the selection of the resin of the temporary protective material used in the process and the adjustment of physical properties thereof. The use of a specific manufacturing process in combination with a temporary protective material whose elastic modulus is appropriately controlled has been found to be extremely important for solving the above problem, and the present invention has been accomplished.

The present invention provides a method for manufacturing an electronic component having an electromagnetic shield, the method comprising:

a bonding step of bonding a temporary protective material on the workpiece with the unevenness on the surface thereof;

a photocuring step of curing the temporary protective material by light irradiation;

a dicing step of singulating the workpiece and the temporary protective material;

a shielding step of forming a metal film on the portion of the singulated workpiece, the portion having no temporary protective material bonded thereon; and a peeling step of peeling the temporary protective material from the workpiece having the metal film formed and, wherein the temporary protective material is formed from a resin composition for temporary protection with an elastic modulus at 25° C. of 3 MPa or less and an elastic modulus at 25° C. of 40 MPa or more after light irradiation with an exposure dose of 500 mJ/cm$^2$ or more.

According to the manufacturing method of the present invention, a small electronic component is manufactured, the component having a metal film electromagnetic shield formed on the desired portion.

Typically, when bonding a workpiece and a viscous material such as a temporary protective material together, a phenomenon called bleeding may occur in which the viscous material protrudes from the end and wraps around the side of the workpiece. When a metal film is formed on the workpiece with the bleeding, the metal film is also formed on the bleeding itself, and when the bleeding is peeled off together with the temporary protective material, a portion where the metal film is not formed is exposed on the side surface of the workpiece. For example, when simply bonding a temporary protective material on a workpiece prepared through downsizing in advance by dicing or the like, and forming a metal film thereon, an electronic component having a desired electromagnetic shield is difficult to be obtained due to the influence of the bleeding.

It is conceivable to study a resin design with no bleeding. However, when the suppression of the bleeding is required too much, the temporary protective material cannot be embedded in the unevenness of the workpiece sufficiently. Insufficient embeddability causes void to be left at the bonding interface, and thus the expansion of the void during heating in forming the metal film provides space at the bonding interface. Thereby, the metal film is formed also in the portion which should be protected by the temporary protective material.

In order to cope with this problem, in the present invention, ingenuity is made in the steps and resin physical properties, so that it is unnecessary (negligible) to cope with the problem of bleeding that may occur on the side surface of the workpiece when bonding the temporary protective material while securing the embeddability in the unevenness by the temporary protective material. In the present invention, at least the bonding step of bonding a workpiece and a temporary protective material together is performed, and then the dicing step of singulating an integral body of both is performed. When these steps are performed in this order, a sample for forming a metal film thereon can be obtained while avoiding the workpiece end where the bleeding may occur. The temporary protective material to be used satisfies the physical properties of an elastic modulus at 25° C. in the bonding step of 3 MPa or less and an elastic modulus at 25° C. in the dicing step after curing of 40 MPa or more. Therefore, sufficient embeddability before curing and excellent dicing performance after curing can be compatible. Excellent dicing performance means that it is hard to generate burr derived from a temporary protective material during dicing. Insufficient suppression of the generation of burr inhibits good formation of a metal film.

As described above, according to the present invention using a specific manufacturing process in combination with a specific temporary protective material, a small electronic component can be obtained on which an electromagnetic shield is formed at a desired location including the side surface.

In the manufacturing method of the present invention, the resin composition preferably has a tack force at 25° C. of 1 to 5 N as measured by the probe tack test after the light irradiation at the exposure amount of 500 mJ/cm$^2$ or more to the resin composition for temporary protection. This enables the improvement of the dicing properties more multifacetedly. Specifically, this enables not only suppressing the generation of burrs derived from the temporary protective material at dicing, but also easily suppressing the currence of flying of the workpiece due to the cutting stress at dicing.

In the manufacturing method of the present invention, preferably, the resin composition for temporary protection comprises a (meth)acrylic copolymer (A) comprising a (meth)acrylic monomer ($\alpha$1) and a (meth)acrylic monomer ($\alpha$2) as copolymer components, a homopolymer of the (meth)acrylic monomer ($\alpha$1) having a glass transition temperature of 50° C. or more and a homopolymer of the (meth)acrylic monomer ($\alpha$2) having a glass transition temperature of 0° C. or less. In this case, the weight average molecular weight of the (meth)acrylic copolymer (A) is more preferably 100000 to 1000000. This can improve the heat resistance and peelability of the resin composition for temporary protection.

In the manufacturing method of the present invention, the resin composition for temporary protection preferably further comprises a (meth)acrylic monomer (B). This can further improve the elastic modulus after curing by light irradiation.

In the manufacturing method of the present invention, the resin composition for temporary protection preferably further comprises a photoradical polymerization initiator (C). This can further improve the elastic modulus after curing by light irradiation.

In the manufacturing method of the present invention, the resin composition for temporary protection preferably further comprises a silicone compound (D). This can further improve the peelability of the temporary protective material from the workpiece. In particular, the temporary protective material can be easily peeled from the workpiece without using a solvent.

In the manufacturing method of the present invention, the resin composition for temporary protection preferably further comprises a thermally curable component (E) which is liquid at room temperature. This easily suppresses the occurrence of the flying of the workpiece due to the cutting stress at dicing.

The manufacturing method of the present invention may further comprise a thermally curing step of further curing the temporary protective material by heating after the dicing step. This can further improve the peelability of the temporary protective material from the workpiece.

In the manufacturing method of the present invention, the temporary protective material is preferably in the form of a film. This can improve the handleability during the manufacturing step and can efficiently perform the sputtering of the workpiece.

The present invention also provides a resin composition for temporary protection, the resin composition being for forming a temporary protective material and used for a method for manufacturing an electronic component having an electromagnetic shield, and the method comprises:

a bonding step of bonding a temporary protective material on the workpiece with the unevenness on the surface thereof;

a photocuring step of curing the temporary protective material by light irradiation;

a dicing step of singulating the workpiece and the temporary protective material;

a shielding step of forming a metal film on a portion of the singulated workpiece, the portion having no temporary protective material bonded thereon; and a peeling step of peeling the temporary protective material from the workpiece having the metal film formed. The composition has an elastic modulus at 25° C. of 3 MPa or less and an elastic modulus at 25° C. 40 MPa or more after light irradiation with an exposure dose of 500 mJ/cm$^2$ or more.

The temporary protective material formed of such a resin composition has excellent bonding properties to the workpiece at low-temperature before curing, while it has good dicing properties when singulated together with the workpiece after curing (it is possible to singulate them with reducing burrs).

The resin composition for temporary protection of the present invention preferably has a tack force of 1 to 5 N as measured at 25° C. by the probe tack test after the light irradiation at the exposure dose of 500 mJ/cm$^2$ or more. This can not only suppress the generation of burrs derived from the temporary protective material at dicing but also easily suppress the occurrence of flying of the workpiece due to the cutting stress at dicing.

Preferably, the resin composition for temporary protection of the present invention comprises a (meth)acrylic copolymer (A) comprising a (meth)acrylic monomer ($\alpha$1) and a (meth)acrylic monomer ($\alpha$2) as copolymer components, a homopolymer of the (meth)acrylic monomer ($\alpha$1) having a glass transition temperature of 50° C. or more and a homopolymer of the (meth)acrylic monomer ($\alpha$2) having a glass transition temperature of 0° C. or less. In this case, the weight average molecular weight of the (meth)acrylic copolymer (A) is more preferably 100000 to 1000000. This can improve the heat resistance and peelability.

The resin composition for temporary protection of the present invention preferably further comprises a (meth) acrylic monomer (B). This can further improve the elastic modulus after curing by light irradiation.

The resin composition for temporary protection of the present invention preferably further comprises a photoradical polymerization initiator (C). This can further improve the elastic modulus after curing by light irradiation.

The resin composition for temporary protection of the present invention preferably further comprises a silicone compound (D). This can further improve the peelability of the temporary protective material from the workpiece. In particular, the temporary protective material can be easily peeled from the workpiece without using a solvent.

The resin composition for temporary protection of the present invention preferably further comprises a thermally curable component (E) which is liquid at room temperature. This easily suppresses the occurrence of the flying of the workpiece due to the cutting stress at dicing.

The resin composition for temporary protection of the present invention may be used in the manufacturing method further comprising a thermally curing step of further curing the temporary protective material by heating after the dicing step.

The present invention further provides a resin film for temporary protection obtained by forming the above resin composition for temporary protection into a film. The film formed from the above resin composition for temporary protection has not only the above characteristic of the resin composition for temporary protection and but also excellent handleability during the manufacturing step. Moreover, sputtering to a workpiece can be efficiently performed by using the resin film for temporary protection.

Advantageous Effects of Invention

The present invention can provide a new method for manufacturing an electronic component having an electromagnetic shield. The present invention can also provide a resin composition for temporary protection for forming a temporary protective material and a resin film for temporary protection obtained by forming the resin composition for temporary protection into a film, the resin composition and the resin film being used in the manufacturing method.

The resin composition for temporary protection or resin film for temporary protection according to the present invention can bond to a workpiece having unevenness on the surface thereof with good embeddability and can be subjected to dicing together with a workpiece after curing by light irradiation.

BRIEF DESCRIPTION OF DRAWINGS

FIG. 1 shows a step schematic diagram showing a manufacturing method according to one embodiment of the present invention.

DESCRIPTION OF EMBODIMENTS

Hereinafter, preferred embodiments of the present invention will be described in detail. However, the present invention is not limited to the following embodiments.

<Method for Manufacturing an Electronic Component>

The method for manufacturing an electronic component according to the present embodiment is a method for manufacturing an electronic component having an electromagnetic shield and at least comprises:

a bonding step of bonding a temporary protective material on a workpiece with unevenness on the surface thereof;

a photocuring step of curing the temporary protective material by light irradiation;

a dicing step of singulating the workpiece and the temporary protective material;

a shielding step of forming a metal film on the portion of the singulated workpiece, the portion having no temporary protective material bonded thereon; and a peeling step of peeling the temporary protective material from the workpiece having the metal film formed.

The manufacturing method of the present embodiment can comprise a thermally curing step of further curing the temporary protective material by heating after the dicing step. That is, the method for manufacturing an electronic component according to the present embodiment is a method for manufacturing an electronic component having an electromagnetic shield and may at least comprise:

the bonding step of bonding a temporary protective material on a workpiece with unevenness on the surface thereof;

the photocuring step of curing the temporary protective material by light irradiation;

the dicing step of singulating the workpiece and the temporary protective material;

the thermally curing step of further curing the temporary protective material by heating;

the shielding step of forming a metal film on the portion of the singulated workpiece, the portion having no temporary protective material bonded thereon; and the peeling step of peeling the temporary protective material from the workpiece having the metal film formed.

Hereinafter, each step will be described with reference to the drawings as appropriate.

(Bonding Step: FIG. 1(A) to FIG. 1(B))

In this step, the temporary protective material 20 is bonded to the workpiece 10 having unevenness on the surface. As shown in FIG. 1(A), the workpiece 10 comprises the convex portion 2 on the substrate 1.

The workpiece 10 is not particularly limited, and examples thereof include a BGA (Ball Grid Array) package, an LGA (Land Grid Array) package. Specific examples of a BGA package include a semiconductor substrate having a plurality of bumps (convex portions) on one surface and the other surface sealed by a sealing material. The height of the bump is about 5 to 300 μm.

As the temporary protective material 20, a resin film for temporary protection formed of a predetermined resin composition for temporary protection described below can be used. The resin film for temporary protection is the temporary protective material in the form of a film. The film can comprise the base film 30, such as a polyethylene terephthalate film, on the surface opposite to the surface to be bonded to the workpiece.

When bonding the temporary protective material 20 to the workpiece 10, a roll laminator, a vacuum laminator, or the like can be used. For example, when using a vacuum laminator, the bonding can be performed by using a vacuum laminator LM-50×50-S (product name, manufactured by NPC Co., Ltd.), a vacuum laminator V130 (product name, manufactured by Nichigo Morton Co., Ltd.), or the like under the conditions of an atmospheric pressure of 1.5 hPa or less (preferably 1 hPa or less), a laminating temperature of 25 to 180° C. (preferably 40 to 120° C.), a laminating pressure of 0.01 to 0.5 MPa (preferably 0.1 to 0.5 MPa), and a holding time of 1 to 600 seconds (preferably 30 to 300 seconds).

(Photocuring Step: FIG. 1(C))

In this step, light irradiation is performed on the temporary protective material 20 bonded to the workpiece 10, to thereby photocure the temporary protective material. Light irradiation can be performed from the side of the base film 30, which is the surface opposite to the bonding surface of the temporary protective material 20. In Figure, the temporary protective material 20 photocured is the temporary protective material 20c.

Examples of irradiating light includes ultraviolet rays (UV), and irradiation is performed at an exposure dose (accumulated irradiation dose) of 500 mJ/cm$^2$ or more to the temporary protective material 20. The exposure dose is at least 500 mJ/cm$^2$, since insufficient curing of the temporary protective material may occur when the exposure dose is less than 500 mJ/cm$^2$. The upper limit of the exposure dose is not particularly limited, but can be about 3000 mJ/cm$^2$ in view of work efficiency. For light irradiation, for example, a UV-330 HQP-2 exposure machine (product name, manufactured by Oak Manufacturing Co., Ltd.) capable of irradiating UV can be used.

(Dicing Step: FIG. 1(D))

In this step, dicing of integral body of the workpiece 10 and the temporary protective material 20c photocured is performed, to thereby singulate the integral body. Specifically, the base film 30 is peeled off from the temporary protective material 20c and the resulting integral body is placed on the dicing tape 40, and singulated by, for example, fully automatic dicing saw DFD-6361 (product name, manufactured by Disco Corporation) or the like.

In order to perform the shielding step described below, the singulated integral body is transported onto a heat-resistant adhesive tape 50 such as a polyimide tape, as shown in FIG. 1(E).

(Thermally Curing Step: FIG. 1(E))

When the method comprises the thermally curing step, the thermally curing step is performed after the dicing step. In this step, thermal treatment (heating) is performed on the temporary protective material 20c bonded to the workpiece 10 to further thermally cure the temporary protective material. This can improve the peelability of the temporary protective material 20c from the workpiece 10. For the thermal treatment, inert oven DN410I (product name, manufactured by Yamato Scientific Co., Ltd.) or the like can be used. The thermal treatment conditions are not particularly limited, but may be one-step heating or multi-step heating. In the case of multi-step heating, for example, thermal treatment conditions of 130° C. for 30 minutes and then 170° C. for 60 minutes can be used.

(Shielding Step and Peeling Step: FIG. 1 (F))

In these steps, a metal film M to be an electromagnetic shield is formed on at least a portion of the workpiece 10 in the singulated integral body, the portion having no temporary protective material 20c bonded thereon, and thereafter, the temporary protective material 20c are peeled from the workpiece 10 on which the metal film M is formed.

The metal film M is formed using, for example, a known sputtering apparatus (for example, sputtering apparatus SDH series: product name, manufactured by ULVAC, Inc.) under the conditions of, for example, a temperature of 60 to 150° C., a pressure of $1 \times 10^{-1}$ Pa to $10 \times 10^{-1}$ Pa, and a target metal of copper or the like. The thickness of the metal film M to be formed is about 0.1 to 10 μm. Since the temporary protective material 20c is peeled off in this step, the metal film M may be formed on the surface of the temporary protective material 20c.

The workpiece 10 on which the metal film M is formed is peeled off from the temporary protective material 20c by picking up the workpiece 10 with a predetermined collet C, for example. For peeling of the both, a die bonder BESTEM-02 (product name, manufactured by Canon Machinery Co., Ltd.) or the like can be used.

In the manufacturing method according to the present embodiment, a material formed from the predetermined resin composition for temporary protection shown below is used as a temporary protective material. Hereinafter, the resin composition for temporary protection and the resin film for temporary protection are described.

<Resin Composition for Temporary Protection>

The resin composition for temporary protection according to the present embodiment is a resin composition that is for temporary protection for forming a temporary protective material and used for the above method for manufacturing an electronic component having an electromagnetic shield, wherein the resin composition has an elastic modulus at 25° C. of 3 MPa or less and an elastic modulus at 25° C. of 40 MPa or more after light irradiation with an exposure dose of 500 mJ/cm$^2$ or more.

Specifically, the resin composition is a resin composition for temporary protection that is for forming the temporary protective material and used for the method for manufacturing an electronic component having an electromagnetic shield, the method comprising:

the bonding step of bonding a temporary protective material on the workpiece with the unevenness on the surface thereof;

the photocuring step of curing the temporary protective material by light irradiation;

the dicing step of singulating the workpiece and the temporary protective material;

the shielding step of forming a metal film on the portion of the singulated workpiece, the portion having no temporary protective material bonded thereon; and the peeling step of peeling the temporary protective material from the workpiece having the metal film formed, and wherein the resin composition has an elastic modulus at 25° C. of 3 MPa or less and an elastic modulus at 25° C. of 40 MPa or more after light irradiation with an exposure dose of 500 mJ/cm$^2$ or more. As described above, the resin composition for temporary protection of the present embodiment can be used also in the manufacturing method further comprising the thermally curing step of further curing a temporary protective material by heating after the dicing step.

The resin composition for temporary protection according to the present embodiment can achieve both sufficient embeddability before curing and excellent dicing properties after curing. When the resin composition designed in this way is used in the above specific manufacturing step, a small electronic component can be manufactured on which an electromagnetic shield of a metal film is formed on a desired portion.

For example, for a workpiece having solder bumps mounted on a circuit surface, such as a BGA package, and having surface unevenness exceeding several hundred μm in height, it is difficult to bond conventionally well-known support tapes (back grind tapes, dicing tapes, or the like) on the workpiece to fill unevenness, and to peel the support tapes from the surface of the workpiece after desired processing. This is especially true when the desired processing comprises dicing, and the conventionally well-known tapes are uneasy to balance the contradictory characteristics of the softness at bonding to a workpiece and the hardness for withstanding dicing, since no design was made focusing on such characteristics. When a conventionally well-known support tape is used, there is a possibility that the unevenness on the surface of the workpiece cannot be sufficiently filled up with the tape to easily generate a space, or dicing cannot be performed well due to insufficient hardness. When the embeddability and the dicing property are insufficient, as described above, the electromagnetic shield cannot be formed on the desired portion of the workpiece.

When the elastic modulus (elastic modulus before photocuring) at 25° C. of the resin composition for temporary protection is 3 MPa or less, the temporary protective material can bonded to the workpiece without damaging the workpiece typified by the semiconductor element and also without generating a space when filling the unevenness. From such a viewpoint, the elastic modulus is preferably 2 MPa or less, and more preferably 1 MPa or less. The lower limit of the elastic modulus can be 0.1 MPa in view of good bonding property.

When the elastic modulus (elastic modulus after photocuring) at 25° C. after light irradiation with an exposure dose of 500 mJ/cm$^2$ or more of the resin composition for temporary protection is 40 MPa or more, generation of burrs derived from the temporary protective material can be suppressed when singulating an integral body of the workpiece and temporary protective material with a dicer. The term "burr" as used herein refers to an unnecessary protrusion formed on the processed surface when dicing the temporary protective material. From such a viewpoint, the elastic modulus is preferably 50 MPa or more, and more preferably 80 MPa or more. The upper limit of the elastic modulus can be 500 MPa in view of good dicing property.

The elastic modulus can be measured, for example, using a dynamic viscoelastic device Rheogel-E4000 (product name, manufactured by UMB, Inc.).

The resin composition for temporary protection preferably has a tack force of 1 to 5 N as measured at 25° C. by the probe tack test after the light irradiation at the exposure dose of 500 mJ/cm$^2$ or more. This can suppress the flying of the workpiece when the integrated body of the workpiece and the temporary protective material is singulated with a dicer. Such a range of the tack force is particularly suitable for processing workpieces having a small size of 10 mm square or less and further 5 mm square or less, which are typified by a semiconductor element. This is because it is easy for the workpiece to fly due to the cutting stress at dicing when the size of the workpiece is small. From such a viewpoint, the tack force is preferably 1.5 N or more and more preferably 2 N or more. The upper limit of the tack force can be 5 N or less in view of the transportability of the workpiece thereafter.

Thus, in view of tack force and dicing property, the resin composition of the present embodiment can also be regarded as a resin composition for temporary protection that is for forming a temporary protective material and used for the above method for manufacturing an electronic component having an electromagnetic shield, wherein the resin composition having a tack force of 1 to 5 N as measured at 25° C. by the probe tack test after light irradiation with an exposure dose of 500 mJ/cm$^2$ or more.

The tack force can be measured, for example, using a tacking tester (manufactured by Lesca Co., Ltd.).

In the present embodiment, the specific formulation of the resin composition for temporary protection are not particularly limited as long as the resin composition has the elastic modulus as described above and tack force as needed. Proper control of the elastic modulus before photocuring of the resin composition for temporary protection realizes bonding with the workpiece without generating voids, and proper control of the elastic modulus after photocuring and the tacking force as needed can realize dicing and peeling with substantially no residue on the surface of the workpiece and the support after peeling even in the workpiece having a small size. An exemplary resin composition will be described below which includes a (meth)acrylic copolymer, a (meth)acrylic monomer, and a liquid thermally curable component as main components, and also includes a photoradical polymerization initiator as a photoreaction controlling component and a silicone compound as a mold release component, but those skilled in the art can appropriately implement other modifications.

<(Meth)Acrylic Copolymer (A)>

Appropriate selection and blend of the (meth)acrylic copolymer and the silicone compound improves the peelability without prior application of the mold release component, and thus can suppress the generation of a residue after peeling. Herein, (meth)acrylic is used for the meaning of either acrylic or methacrylic.

The component (A) preferably comprises a (meth)acrylic monomer ($\alpha$1) and a (meth)acrylic monomer ($\alpha$2) as copolymer components, a homopolymer of the (meth)acrylic monomer ($\alpha$1) having a glass transition temperature of 50° C. or more and a homopolymer of the (meth)acrylic monomer ($\alpha$2) having a glass transition temperature of 0° C. or less. Using the monomer ($\alpha$1) can improve the heat resistance of the resin film for temporary protection formed from the resin composition for temporary protection. Using the monomer ($\alpha$2) can improve the low temperature bonding property and the peelability. The component (A) may contain monomers other than these as a copolymer component.

The glass transition temperature of the homopolymer is known from various literatures, catalogs, or the like and is described in, for example, J. Brandup, E. H. Immergut, E. A. Grulke: Polymer Handbook. 4th Ed., John Wiley & Sons, 2003. For monomers that are not described in various literatures, the glass transition temperature thereof can be measured by DSC with, for example, a thermal differential scanning calorimeter Thermo Plus 2 (product name, manufactured by Rigaku Corporation).

Examples of the monomer ($\alpha$1) includes methyl methacrylate (105° C.), ethyl methacrylate (65° C.), t-butyl methacrylate (107° C.), cyclohexyl methacrylate (66° C.), adamantyl acrylate (153° C.), adamantyl methacrylate (183° C.), isobornyl acrylate (94° C.), isobornyl methacrylate (180° C.), dicyclopentanyl acrylate (120° C.), dicyclopentanyl methacrylate (175° C.), benzyl methacrylate (54° C.), and tetrahydrofurfuryl methacrylate (60° C.). These compounds can be used singly or in combination of two or more. The temperature in the parentheses indicates the glass transition temperature of the homopolymer.

In view of heat resistance, the monomer ($\alpha$1) is more preferably a (meth)acrylic monomer a homopolymer of which has a glass transition temperature of 70° C. or more, and further preferably a (meth)acrylic monomer a homopolymer of which has a glass transition temperature of 90° C. or more. The upper limit of the glass transition temperature is not particularly limited, but can be 300° C. or less in view of easily maintaining the step embedding property.

The component (A) preferably comprises, as a copolymerization component, 5 to 70% by mass, more preferably 10 to 60% by mass, and further preferably 15 to 50% by mass of the monomer (α1) based on the total amount of the copolymerization component. When the amount of the monomer (α1) is 5% by mass or more, the heat resistance of the resin film for temporary protection formed from the resin composition for temporary protection can be improved, and when the amount of the monomer (α1) is 70% by mass or less, the low temperature bonding property can be further improved.

Examples of the monomer (α2) include ethyl acrylate (−22° C.), propyl acrylate (−37° C.), isopropyl acrylate (−3° C.), butyl acrylate (−49° C.), isobutyl acrylate (−24° C.), s-butyl acrylate (−22° C.), hexyl acrylate (−57° C.), hexyl methacrylate (−5° C.), heptyl acrylate (−60° C.), octyl acrylate (−65° C.), 2-ethylhexyl acrylate (−50° C.), 2-ethylhexyl methacrylate (−10° C.), isooctyl acrylate (−58° C.), nonyl acrylate (−58° C.), isononyl acrylate (−58° C.), decyl methacrylate (−70° C.), isodecyl methacrylate (−41° C.), lauryl acrylate (−3° C.), lauryl methacrylate (−65° C.), isostearyl acrylate (−18° C.), 2-methoxyethyl acrylate (−50° C.), tetrahydrofurfuryl acrylate (−12° C.). These compounds can be used singly or in combination of two or more. The temperature in the parentheses indicates the glass transition temperature of the homopolymer.

The monomer (α2) is more preferably a (meth)acrylic monomer a homopolymer of which has a glass transition temperature of −10° C. or less in view of low-temperature bonding property and peelability, and further preferably a (meth)acrylic monomer a homopolymer of which has a glass transition temperature of −20° C. or less. The lower limit of the glass transition temperature is not particularly limited, but can be −100° C. or more in view of easily maintaining the handleability of the film.

In view of further improving the peelability, the monomer (α2) is preferably a (meth)acrylic monomer having an alkyl group having 6 to 20 carbon atoms. Examples of such a monomer include hexyl acrylate (−57° C.), hexyl methacrylate (−5° C.), heptyl acrylate (−60° C.), octyl acrylate (−65° C.), 2-ethylhexyl acrylate (−50° C.), 2-ethylhexyl methacrylate (−10° C.), isooctyl acrylate (−58° C.), nonyl acrylate (−58° C.), isononyl acrylate (−58° C.), decyl methacrylate (−70° C.), isodecyl methacrylate (−41° C.), lauryl acrylate (−3° C.), lauryl methacrylate (−65° C.), and isostearyl acrylate (−18° C.). These compounds can be used singly or in combination of two or more. The temperature in the parentheses indicates the glass transition temperature of the homopolymer.

The component (A) preferably comprises, as a copolymerization component, 20 to 90% by mass, more preferably 30 to 85% by mass, and further preferably 40 to 70% by mass of the monomer (α2) based on the total amount of the copolymerization component. When the amount of the monomer (α2) is 20% by mass or more, the low temperature bonding property and peelability of the resin film for temporary protection formed from the resin composition for temporary protection can be improved, and when an amount of the monomer (α2) is 90% by mass or less, the heat resistance can be further improved.

Radical polymerization can be utilized for the synthesis of the component (A). Examples of the method of radical polymerization include solution polymerization, suspension polymerization, and bulk polymerization, and the suspension polymerization is preferable. The solution polymerization tends to make it difficult to increase the molecular weight, and the bulk polymerization tends to be uneasy to control the heat industrially.

The (meth)acrylic copolymer as the component (A) preferably has a reactive functional group. Examples of the reactive functional group include an epoxy group, a carboxylic acid group, a hydroxyl group, and an acryloyl group.

The component (A) is preferably a (meth)acrylic copolymer having the reactive functional groups that are not unevenly distributed. In order to obtain the (meth)acrylic copolymer without uneven distribution of reactive functional groups, it is preferable to use living radical polymerization among radical polymerization methods. A copolymer in which a (meth)acrylic monomer having a reactive functional group having a high reaction rate is not unevenly distributed is obtained through living radical polymerization as compared with general radical polymerization. In this case, it is more preferable to add a (meth)acrylic monomer having a reactive functional group having a high reaction rate later. This can further easily provide a copolymer in which the (meth)acrylic monomer having a reactive functional group having a high reaction rate is not unevenly distributed.

As the living radical polymerization, atom transfer radical polymerization (ATRP polymerization), reversible addition-fragmentation chain transfer polymerization (RAFT polymerization), and the like are known, and any method can be used. The polymerization is more preferably performed by RAFT polymerization.

RAFT polymerization is characterized by using a polymerization initiator and a reversible addition fragmentation chain transfer agent (hereinafter referred to as RAFT agent). This polymerization is superior to other living radical polymerizations in productivity, specifically in the fact that it is applicable to various monomers and applicable to a wide range of reaction conditions.

Examples of RAFT agents include dithiocarbonates such as O-ethyl-S-(1-phenylethyl) dithiocarbonate, O-ethyl-S-(2-propoxyethyl) dithiocarbonate, and O-ethyl-S-(1-cyano-1-methylethyl) dithiocarbonate; dithioesters such as cyanoethyl dithiopropionate, benzyl dithiopropionate, benzyl dithiobenzoate, and acetoxyethyl dithiobenzoate; dithiocarbamates such as S-benzyl-N, N-dimethyl dithiocarbamate and benzyl-1-pyrrole carbodithioate; and trithiocarbonates such as dibenzyl trithiocarbonate and S-cyanomethyl-S-dodecyl trithiocarbonate.

Preferably, the RAFT agent used is optimally selected in accordance with the reactivity of the monomer. Particularly, dithiocarbamates and dithiocarbonates are suitable for the polymerization of acrylic acid esters, and dithioesters are suitable for the polymerization of methacrylic acid esters.

The amount of the RAFT agent used is preferably 0.01-10 parts by mass and more preferably 0.05-3 parts by mass with respect to 100 parts by mass of total amounts of the monomers. When the amount is 0.01 parts by mass or more, the reaction can be easily controlled, and when the amount is 10 parts by mass or less, the copolymer to be obtained does not have too low a molecular weight.

When the suspension polymerization method is used to obtain a (meth)acrylic copolymer, a (meth)acrylic monomer having a reactive functional group having a high reaction rate may be added to a dispersion obtained by blending a (meth)acrylic monomer, a polymerization initiator, and water while heating and stirring the dispersion to thereby perform polymerization, in order to suppress the uneven distribution of (meth)acrylic monomers having a reactive functional group having a high reaction rate. The method of addition may be continuous addition while heating and stirring, or may be addition in several portions at intervals.

Examples of the radical polymerization initiator include organic peroxides such as benzoyl peroxide, lauroyl peroxide, di-t-butylperoxyhexahydroterephthalate, t-butylperoxy-2-ethylhexanoate, 1,1-t-butylperoxy-3,3,5-trimethylcyclohexane, and t-butylperoxyisopropyl carbonate; azo compounds such as azobisisobutyronitrile, azobis-4-methoxy-2,4-dimethyl valeronitrile, azobiscyclohexanone-1-carbonitrile, and azodibenzoyl.

The amount of the polymerization initiator blended is preferably in the range of 0.01 to 10 parts by mass, more preferably 0.05 to 5 parts by mass, and further preferably 0.1 to 3 parts by mass, with respect to 100 parts by mass of the total amount of the (meth)acrylic monomers. When the amount of the polymerization initiator blended is 0.01 parts by mass or more, the polymerization sufficiently proceeds, and when the amount is 10 parts by mass or less, the copolymer to be obtained does not have too low a molecular weight.

When the suspension polymerization method is used, a suspending agent is added in an aqueous medium. Examples of the suspending agent include water soluble polymers such as polyvinyl alcohol, methyl cellulose, and polyacrylamide; and poorly soluble inorganic substances such as calcium phosphate and magnesium pyrophosphate, and among them, nonionic water-soluble polymers such as polyvinyl alcohol are preferred. When ionic water-soluble polymers, poorly soluble inorganic substances, and the like are used, a large amount of ionic impurities tends to remain in the obtained resin composition. The water soluble polymer is preferably used in an amount of 0.01 to 1 part by mass with respect to 100 parts by mass of the total amount of the monomer mixture.

Examples of a molecular weight modifier used for suspension polymerization include mercaptan compounds, thioglycol, carbon tetrachloride, and α-methylstyrene dimer, and these can be added as needed.

Even when using the solution polymerization to obtain a (meth)acrylic copolymer, a (meth)acrylic monomer having a reactive functional group having a high reaction rate may be additionally added to perform polymerization, in order to suppress the uneven distribution of (meth)acrylic monomer having a reactive functional group having a high reaction rate, as in the above-described suspension polymerization method. The method of addition may be continuous addition while heating and stirring, or may be addition in several portions at intervals.

Examples of the solvent used for solution polymerization include ketone organic solvents such as acetone, methyl ethyl ketone, methyl isobutyl ketone, and cyclohexanone; ester organic solvents such as ethyl acetate, butyl acetate, methyl lactate, ethyl lactate, and γ-butyrolactone; polyhydric alcohol alkyl ether organic solvents such as ethylene glycol monoethyl ether, ethylene glycol monobutyl ether, ethylene glycol dimethyl ether, ethylene glycol diethyl ether, propylene glycol monomethyl ether, propylene glycol dimethyl ether, diethylene glycol monomethyl ether, diethylene glycol monobutyl ether, and diethylene glycol dimethyl ether; polyhydric alcohol alkyl ether acetates such as ethylene glycol monomethyl ether acetate, propylene glycol monomethyl ether acetate, and diethylene glycol monomethyl ether acetate; and amide organic solvents such as N, N-dimethylformamide, N, N-dimethylacetamide, and N-methylpyrrolidone. These organic solvents can be used singly or in combination of two or more.

The (meth)acrylic monomer mixture concentration at the beginning of solution polymerization is preferably 40 to 70% by mass and more preferably 50 to 60% by mass. When the (meth)acrylic monomer mixture concentration is 40% by mass or more, the molecular weight of the copolymer to be obtained easily increases.

The glass transition temperature of the component (A) is preferably −50 to 50° C. When the glass transition temperature is −50° C. or more, too high a fluidity and adhesiveness of the resin composition for temporary protection can be easily suppressed, thereby improving the handleability and peelability of the formed resin film for temporary protection. On the other hand, when the glass transition temperature is 50° C. or less, the flowability and adhesiveness of the resin composition for temporary protection can be easily secured, thereby improving the low temperature bonding property of the resin film for temporary protection to be formed and embeddability thereof in unevenness (protrusions such as bumps) on the surface of the workpiece. From this viewpoint, the glass transition temperature of the component (A) is more preferably −40 to 40° C. and furthermore preferably −30 to 30° C. The glass transition temperature of the component (A) is a midpoint glass transition temperature measured using DSC. Specifically, it is a midpoint glass transition temperature obtained by measuring the calorie change under the conditions of a temperature rising rate of 10° C./minute and a measurement temperature of −80 to 80° C. and calculating by the method according to JIS K 7121.

The weight average molecular weight of the component (A) is preferably 100000 to 1000000. When the weight average molecular weight is 100000 or more, the heat resistance and peelability of the resin film for temporary protection formed from the resin composition for temporary protection can be further improved. When the weight average molecular weight is 1000000 or less, the film forming property and fluidity of the resin composition for temporary protection can be further improved, and thus the embeddability in unevenness of the surface of the workpiece can be further improved. From this viewpoint, the weight average molecular weight is more preferably 150000 or more, further preferably 250000 or more, and more preferably 800000 or less, further preferably 500000 or less. The weight average molecular weight is in terms of polystyrene and obtained using a calibration curve with standard polystyrene in gel permeation chromatography (GPC).

<(Meth)Acrylic Monomer (B)>

The use of the (meth)acrylic monomer can suppress the generation of spaces in filling unevenness and can also improve the machinability in the dicing step.

As the component (B) in the present embodiment, any of monofunctional (meth)acrylates, bifunctional (meth)acrylates, and polyfunctional (meth)acrylates can be used, and known ones can be used without particular limitation.

Examples of the monofunctional (meth)acrylates include aliphatic (meth)acrylates such as methyl (meth)acrylate, ethyl (meth)acrylate, propyl (meth)acrylate, isopropyl (meth)acrylate, butyl (meth)acrylate, isobutyl (meth)acrylate, sec-butyl (meth)acrylate, tert-butyl (meth)acrylate, butoxyethyl (meth)acrylate, pentyl (meth)acrylate, hexyl (meth)acrylate, 2-ethylhexyl (meth)acrylate, heptyl (meth)acrylate, octyl heptyl (meth)acrylate, nonyl (meth)acrylate, decyl (meth)acrylate, undecyl (meth)acrylate, lauryl (meth)acrylate, tridecyl (meth)acrylate, tetradecyl (meth)acrylate, pentadecyl (meth)acrylate, hexadecyl (meth)acrylate, stearyl (meth)acrylate, behenyl (meth)acrylate, 2-hydroxyethyl (meth)acrylate, 2-hydroxypropyl (meth)acrylate, 3-chloro-2-hydroxypropyl (meth)acrylate, 2-hydroxybutyl (meth)acrylate, methoxypolyethylene glycol (meth)acrylate, ethoxy polyethylene glycol (meth)acrylate, methoxy polypropylene glycol (meth)acrylate, ethoxy polypropylene glycol (meth)acrylate, and mono (2-(meth)acryloyloxyethyl) succinate; alicyclic (meth)acrylates such as cyclopentyl (meth)acrylate, cyclohexyl (meth)acrylate, cyclopentyl (meth)acrylate, dicyclopentanyl (meth)acrylate, dicyclopentenyl (meth)acrylate, isobornyl (meth)acrylate, mono (2-(meth)acryloyloxyethyl) tetrahydro phthalate, and mono (2-(meth)acryloyloxyethyl) hexahydrophthalate; aromatic (meth)acrylates such as phenyl (meth)acrylate, benzyl (meth)acrylate, o-biphenyl (meth)acrylate, 1-naphthyl (meth)acrylate, 2-naphthyl (meth)acrylate, phenoxyethyl (meth)acrylate, p-cumyl phenoxyethyl (meth)acrylate, o-phenylphenoxyethyl (meth)acrylate, 1-naphthoxyethyl (meth)acrylate, 2-naphthoxyethyl (meth)acrylate, phenoxy polyethylene glycol (meth)acrylate, nonyl phenoxy polyethylene glycol (meth)acrylate, phenoxy polypropylene glycol (meth)acrylate, 2-hydroxy-3-phenoxypropyl (meth)acrylate, 2-hydroxy-3-(o-phenylphenoxy) propyl (meth)acrylate, 2-hydroxy-3-(1-naphthoxy) propyl (meth)acrylate, and 2-hydroxy-3-(2-naphthoxy) propyl (meth)acrylate; heterocyclic (meth)acrylates such as 2-tetrahydrofurfuryl (meth)acrylate, N-(meth)acryloyloxyethyl hexahydrophthalimide, and 2-(meth)acryloyloxyethyl-N-carbazole; and caprolactone modified products thereof.

Examples of the bifunctional (meth)acrylates include aliphatic (meth)acrylates such as ethylene glycol di(meth)acrylate, diethylene glycol di(meth)acrylate, triethylene glycol di(meth)acrylate, tetraethylene glycol di(meth)acrylate, polyethylene glycol di(meth)acrylate, propylene glycol di(meth)acrylate, dipropylene glycol di(meth)acrylate, tripropylene glycol di(meth)acrylate, tetrapropylene glycol di(meth)acrylate, polypropylene glycol di(meth)acrylate, ethoxylated polypropylene glycol di(meth)acrylate, 1,3-butanediol di(meth)acrylate, 1,4-butanediol di(meth)acrylate, neopentyl glycol di(meth)acrylate, 3-methyl-1,5-pentanediol di(meth)acrylate, 1,6-hexanediol di(meth)acrylate, 2-butyl-2-ethyl-1,3-propanediol di(meth)acrylate, 1,9-nonanediol di(meth)acrylate, 1,10-decanediol di(meth)acrylate, glycerin di(meth)acrylate, tricyclodecane dimethanol (meth)acrylate, and ethoxylated 2-methyl-1,3-propanediol di(meth)acrylate; alicyclic (meth)acrylates such as cyclohexane dimethanol (meth)acrylate, ethoxylated cyclohexane dimethanol (meth)acrylate, propoxylated cyclohexane dimethanol (meth)acrylate, ethoxylated propoxylated cyclohexane dimethanol (meth)acrylate, tricyclodecane dimethanol (meth)acrylate, ethoxylated tricyclodecane dimethanol (meth)acrylate, propoxylated tricyclodecane dimethanol (meth)acrylate, ethoxylated propoxylated tricyclodecane dimethanol (meth)acrylate, ethoxylated hydrogenated bisphenol A di(meth)acrylate, propoxylated hydrogenated bisphenol A di(meth)acrylate, ethoxylated propoxylated hydrogenated bisphenol A di(meth)acrylate, ethoxylated hydrogenated bisphenol F di(meth)acrylate, propoxylated hydrogenated bisphenol F di(meth)acrylate, and ethoxylated propoxylated hydrogenated bisphenol F di(meth)acrylate; aromatic (meth)acrylates such as ethoxylated bisphenol A di(meth)acrylate, propoxylated bisphenol A di(meth)acrylate, ethoxylated propoxylated bisphenol A di(meth)acrylate, ethoxylated bisphenol F di(meth)acrylate, propoxylated bisphenol F di(meth)acrylate, ethoxylated propoxylated bisphenol F di(meth)acrylate, ethoxylated bisphenol AF di(meth)acrylate, propoxylated bisphenol AF di(meth)acrylate, ethoxylated propoxylated bisphenol AF di(meth)acrylate, ethoxylated fluorene di(meth)acrylate, propoxylated fluorene di(meth)acrylate, and ethoxylated/propoxylated fluorene di(meth)acrylate; heterocyclic (meth)acrylates such as ethoxylated isocyanuric acid di(meth)acrylate, propoxylated isocyanuric acid di(meth)acrylate, and ethoxylated propoxylated isocyanuric acid di(meth)acrylate; caprolactone modified products thereof; aliphatic (meth)acrylates such as neopentyl glycol epoxy (meth)acrylate; alicyclic (meth)acrylates such as cyclohexane dimethanol epoxy (meth)acrylate, hydrogenated bisphenol A epoxy (meth)acrylate, and hydrogenated bisphenol F epoxy (meth)acrylate; aromatic epoxy (meth)acrylates such as resorcinol epoxy (meth)acrylate, bisphenol A epoxy (meth)acrylate, bisphenol F epoxy (meth)acrylate, bisphenol AF epoxy (meth)acrylate, and fluorene epoxy (meth)acrylate; and urethane (meth)acrylate. Among them, urethane (meth)acrylate is preferably used.

Examples of trifunctional or higher polyfunctional (meth)acrylates include aliphatic (meth)acrylates such as trimethylolpropane tri(meth)acrylate, ethoxylated trimethylolpropane tri(meth)acrylate, propoxylated trimethylolpropane tri(meth)acrylate, ethoxylated propoxylated trimethylolpropane tri(meth)acrylate, pentaerythritol tri(meth)acrylate, ethoxylated pentaerythritol tri(meth)acrylate, propoxylated pentaerythritol tri(meth)acrylate, ethoxylated propoxylated pentaerythritol tri(meth)acrylate, pentaerythritol tetra (meth)acrylate, ethoxylated pentaerythritol tetra (meth)acrylate, propoxylated pentaerythritol tetra (meth)acrylate, ethoxylated propoxylated pentaerythritol tetra (meth)acrylate, ditrimethylolpropane tetraacrylate, and dipentaerythritol hexa (meth)acrylate; heterocyclic (meth)acrylates such as ethoxylated isocyanuric acid tri(meth)acrylate, propoxylated isocyanuric acid tri(meth)acrylate, and ethoxylated propoxylated isocyanuric acid tri(meth)acrylate; caprolactone modified products thereof; aromatic epoxy (meth)acrylates such as phenolic novolac epoxy (meth)acrylate and cresol novolac epoxy (meth)acrylate; and urethane (meth)acrylate. Among them, aliphatic (meth)acrylates such as dipentaerythritol hexa(meth)acrylate are preferable.

These compounds can be used singly or in combination of two or more, and can also be used in combination with other polymerizable compounds.

The amount of the component (B) blended is preferably 1 to 300 parts by mass and more preferably 5 to 100 parts by mass, with respect to 100 parts by mass of the component (A). When the amount of the component (B) blended is in the above-described range, it is easy to achieve high elasticity after light irradiation. Therefore, the component (B) having a high elastic modulus after photocuring is more preferably selected.

<Photoradical Polymerization Initiator (C)>

The component (C) is not particularly limited as long as it starts polymerization by irradiation with active rays such as ultraviolet rays and visible rays.

The component (C) is not particularly limited and examples thereof include benzoin ketals such as 2,2-dimethoxy-1,2-diphenylethane-1-one; α-hydroxy ketones such as 1-hydroxycyclohexyl phenyl ketone, 2-hydroxy-2-methyl-1-phenylpropan-1-one, 1-[4-(2-hydroxyethoxy)phenyl]-2-hydroxy-2-methyl-1-propan-1-one, and 2-hydroxy-1-{4 [4-(2-hydroxy-2-methylpropionyl)benzyl]phenyl}-2-methylpropan-1-one; glyoxyesters such as methyl phenylglyoxylate, ethyl phenylglyoxylate, oxyphenylacetic acid 2-(2-hydroxyethoxy)ethyl, and oxyphenylacetic acid 2-(2-oxo-2-phenylacetoxyethoxy)ethyl; α-amino ketones such as 2-benzyl-2-dimethylamino-1-(4-morpholin-4-ylphenyl)-butan-1-one, 2-dimethylamino-2-(4-methylbenzyl)-1-(4-morpholin-4-ylphenyl)-buta n-1-one, and 1,2-methyl-1-

[4-(methylthio) phenyl]-(4-morpholine)-2-ylpropan-1-one; oxime esters such as 1,2-octanedione, 1-[4-(phenylthio), 2-(O-benzoyloxime)], ethanon, 1-[9-ethyl-6-(2-methylbenzoyl)-9H-carbazole-3-yl], 1-(O-acetyl oxime); phosphine oxides such as bis(2,4,6-trimethylbenzoyl)phenyl phosphine oxide, bis(2,6-dimethoxybenzoyl)-2,4,4-trimethylpentylphosphine oxide, and 2,4,6-trimethylbenzoyldiphenylphosphine oxide; 2,4,5-triarylimidazole dimers such as 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, 2-(o-methoxyphenyl)-4,5-diphenylimidazole dimer, and 2-(p-methoxyphenyl)-4,5-diphenylimidazole dimer; benzophenone compounds such as benzophenone, N, N, N', N'-tetramethyl-4,4'-diaminobenzophenone, N, N, N', N'-tetraethyl-4,4'-diaminobenzophenone, and 4-methoxy-4'-dimethylaminobenzophenone; quinone compounds such as 2-ethyl anthraquinone, phenanthrene quinone, 2-tert-butyl anthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, and 2,3-dimethyl anthraquinone; benzoin ethers such as benzoin methyl ether, benzoin ethyl ether, and benzoin phenyl ether; benzoin compounds such as benzoin, methylbenzoin, and ethylbenzoin; benzyl compounds such as benzyl dimethyl ketal; acridine compounds such as 9-phenylacridine and 1,7-bis (9,9'-acridinylheptane); N-phenylglycine, and coumarin.

The above photoradical polymerization initiators can be used singly or in combination of two or more. Furthermore, it can also be used in combination with a suitable sensitizer.

The amount of the component (C) blended is preferably 0.05 to 10 parts by mass with respect to 100 parts by mass of the component (A). When the amount of the component (C) blended is in the above range, sufficient reactivity of the (meth)acrylic monomer at sufficient light irradiation can be easily obtained.

<Silicone Compound (D)>

Appropriate selection and blend of the (meth)acrylic copolymer and the silicone compound improves the peelability without prior application of the mold release component and thus can suppress the generation of a residue after peeling.

The component (D) may be a compound having a siloxane moiety, and examples thereof include organopolysiloxanes having no reactive functional groups, organopolysiloxanes having reactive functional groups, silicone modified polyimide resin, silicone modified polyamideimide resin, silicone modified alkyd resin, straight silicone oil, non-reactive modified silicone oil, and reactive modified silicone oil. Among them, silicone resins having reactive functional groups are preferable, in view of the elastic modulus and peelability of the resin film for temporary protection formed from the resin composition for temporary protection, and compatibility with the component (A). Examples of the reactive functional groups include an epoxy group, an oxetanyl group, a carboxyl group, a hydroxy group, an amido group, an amino group, and an acryloyl group, and among them, the acryloyl group is more preferable. These compounds can be used singly or in combination of two or more.

The amount of the component (D) blended is preferably 0.05 to 30 parts by mass with respect to 100 parts by mass of the component (A). When the amount of the component (D) blended is 0.05 parts by mass or more, the peelability of the resin film for temporary protection formed from the resin composition for temporary protection can be improved, and when the amount blended is 30 parts by mass or less, firm bonding with the workpiece can be achieved. From this viewpoint, the amount of the component (D) blended is more preferably 0.1 to 20 parts by mass, further preferably 0.5 to 15 parts by mass, with respect to 100 parts by mass of the component (A).

<(E) Thermally Curable Component that is Liquid at Room Temperature>

The use of a thermally curable component that is liquid at room temperature can improve the adhesion to the dicing tape during the dicing step.

The component (E) is not particularly limited as long as it is a thermally curable component that is liquid at room temperature (for example, about 23° C.), and known components can be used. Examples of such compounds include epoxy resin, cyanate resin, bismaleimide resin, phenol resin, urea resin, melamine resin, alkyd resin, unsaturated polyester resin, diallyl phthalate resin, resorcinol formaldehyde resin, xylene resin, furan resin, polyurethane resin, ketone resin, triallyl cyanurate resin, polyisocyanate resin, resin containing tris (2-hydroxyethyl) isocyanurate, resin containing triaryl trimellitate, resin synthesized from cyclopentadiene, and thermally curable resin obtained by trimerization of aromatic dicyanamide. Among them, a liquid epoxy resin is preferable in view of the tack force, elastic modulus, and peelability of the resin film for temporary protection formed from the resin composition for temporary protection and the compatibility with the component (A). These thermally curable resins can be used singly or in combination of two or more.

The amount of the component (E) blended is preferably 1 to 300 parts by mass and more preferably 3 to 100 parts by mass, with respect to 100 parts by mass of the component (A). When the amount of the component (E) blended is in the above-described range, good tack force of the resin composition for temporary protection after photocuring can be easily obtained. Therefore, it is more preferable to select the component (E) such that the tack force of the resin composition for temporary protection after photocuring is higher.

The resin composition for temporary protection according to the present embodiment can further comprise an inorganic filler in view of improving heat resistance and machinability.

Examples of the inorganic filler include insulating fine particles and whiskers. Examples of the insulating fine particles include glass, silica, alumina, titanium oxide, carbon black, mica, and boron nitride. Among them, silica, alumina, titanium oxide, and boron nitride are preferable in view of handleability, and silica, alumina, and boron nitride are more preferable. Examples of whiskers include aluminum borate, aluminum titanate, zinc oxide, calcium silicate, magnesium sulfate, and boron nitride. These compounds can be used singly or in combination of two or more.

The above inorganic filler preferably has an organic group on the surface. When the surface of the inorganic filler is modified by the organic group, the dispersibility in an organic solvent when preparing the resin composition for temporary protection and the adhesion and heat resistance of the resin film for temporary protection formed from the resin composition for temporary protection can be easily improved.

The average particle diameter of the inorganic filler is preferably 0.01 to 10 μm. When the average particle diameter is 0.01 μm or more, the fluidity of the resin film for temporary protection formed from the resin composition for temporary protection can be ensured, thereby improving the embeddability for protrusions such as bumps on the surface of the workpiece, and when the average particle diameter is 10 µm or less, the precipitation of the inorganic filler in the resin composition for temporary protection can be suppressed. From the same viewpoint, the average particle diameter of the inorganic filler is more preferably 0.05 to 5 µm and particularly preferably 0.1 to 3 µm.

The amount of the inorganic filler blended is 1 to 100 parts by mass with respect to 100 parts by mass of the (meth)acrylic copolymer (A). When the amount blended is 1 part by mass or more, the heat resistance and machinability of the resin film for temporary protection formed from the resin composition for temporary protection can be improved, and when the amount blended is 100 parts by mass or less, the fluidity of the resin film for temporary protection formed from the resin composition for temporary protection can be ensured, thereby improving the embeddability for protrusions such as bumps on the surface of the workpiece. From the same viewpoint, the amount of the inorganic filler blended is more preferably 3 to 70 parts by mass and particularly preferably 5 to 50 parts by mass, with respect to 100 parts by mass of the (meth)acrylic copolymer (A).

An organic filler can be further blended in the resin composition for temporary protection according to the present embodiment. Examples of the organic filler include carbon, rubber fillers, silicone particles, polyamide fine particles, and polyimide fine particles. The amount of the organic filler blended is preferably 50 parts by mass or less, more preferably 40 parts by mass or less, and further preferably 30 parts by mass or less, with respect to 100 parts by mass of the (meth)acrylic copolymer (A).

The resin composition for temporary protection according to the present embodiment may be further including, as needed, so-called additives such as antioxidants, anti-yellowing agents, coloring agents, plasticizers, and stabilizers in an amount that does not adversely affect the desired effect.

The resin composition for temporary protection according to the present embodiment may be further diluted with an organic solvent as needed. The organic solvent is not particularly limited as long as it can dissolve the resin composition, and examples thereof include ketone organic solvents such as acetone, methyl ethyl ketone, methyl isobutyl ketone, and cyclohexanone; ester organic solvents such as ethyl acetate, butyl acetate, methyl lactate, ethyl lactate, and γ-butyrolactone; polyhydric alcohol alkyl ether organic solvents such as ethylene glycol monoethyl ether, ethylene glycol monobutyl ether, ethylene glycol dimethyl ether, ethylene glycol diethyl ether, propylene glycol monomethyl ether, propylene glycol dimethyl ether, diethylene glycol monomethyl ether, diethylene glycol monobutyl ether, and diethylene glycol dimethyl ether; polyhydric alcohol alkyl ether acetates such as ethylene glycol monomethyl ether acetate, propylene glycol monomethyl ether acetate, and diethylene glycol monomethyl ether acetate; and amide organic solvents such as N, N-dimethylformamide, N, N-dimethylacetamide, and N-methylpyrrolidone. These organic solvents can be used singly or in combination of two or more.

The solid content of the resin composition for temporary protections according to the present embodiment is preferably 10 to 80% by mass.

In view of obtaining an appropriate elastic modulus, releasability, tack force after light irradiation, and other properties, the particularly preferable mode of the resin composition for temporary protection according to the present embodiment is a composition containing the (meth)acrylic copolymer (A), the (meth)acrylic monomer (B), the photoradical polymerization initiator (C), the silicone compound (D), and the thermally curable component (E) that is liquid at room temperature, wherein the (meth)acrylic copolymer (A) comprises the (meth)acrylic monomer (α1) and the (meth)acrylic monomer (α2) as copolymer components, a homopolymer of the (meth)acrylic monomer (α1) having a glass transition temperature of 50° C. or more and a homopolymer of the (meth)acrylic monomer (α2) having a glass transition temperature of 0° C. or less; the weight average molecular weight of the (meth)acrylic copolymer is 100000 to 1000000; and the amount of the (meth)acrylic monomer (B) blended is 1 to 300 parts by mass, the amount of the photoradical polymerization initiator (C) blended is 0.05 to 10 parts by mass, and the amount of the silicone compound (D) blended is 0.05 to 30 parts by mass, and the amount of the thermally curable component (E) blended that is liquid at room temperature is 1 to 300 parts by mass, with respect to 100 parts by mass of the (meth)acrylic copolymer (A) component.

<Resin Film for Temporary Protection>

The resin film for temporary protection is obtained by forming the resin composition for temporary protection comprising the components described above in a film form. Specifically, the resin film for temporary protection can be obtained by mixing or kneading the composition in an organic solvent to prepare a varnish, applying the prepared varnish on a base film, and heating and drying it.

The mixing or kneading can be performed using any of normal stirrers and dispersing machines such as sand mills, three rolls, and ball mills, in appropriate combination of them. The heating and drying are not particularly limited as long as the organic solvent used is sufficiently vaporized, and the heating and drying can be performed usually by heating at 60 to 200° C. for 0.1 to 90 minutes.

The organic solvent for preparing the varnish is not particularly limited as long as the components above described can be uniformly dissolved, kneaded, or dispersed, and conventionally known solvents can be used. Methyl ethyl ketone, cyclohexanone, or the like is preferably used in view of high drying speed and low cost.

The above described base film is not particularly limited as long as it transmits light upon light irradiation, and examples thereof include polyester film (polyethylene terephthalate film and the like), polypropylene film (OPP film and the like), polyimide film, polyether imide film, polyether naphthalate film, and methyl pentene film.

The thickness of the resin film for temporary protection is preferably equal to or less than the thickness of the unevenness of the workpiece, and is preferably 5 to 300 µm, in view of sufficiently filling the unevenness on the surface of the workpiece. In the case that the volume of the convex portion is large, the unevenness can be sufficiently filled even when the thickness of the resin film for temporary protection is thinner than the height of the convex portion.

The resin film for temporary protection provided on the base film such as a polyester film can be referred to as a resin film sheet for temporary protection. That is, the resin film sheet for temporary protection can comprise a base film and the resin film for temporary protection on the base film.

The preferable embodiments of the method for manufacturing an electronic component according to the present invention, as well as the resin composition for temporary protection and the resin film for temporary protection used in the method have been described. However, the present invention is not necessarily limited to the embodiments described above and appropriate modifications may be made thereon without departing from the scope of the invention.

EXAMPLES

Hereinafter, the present invention will be more specifically described by way of Examples. The present invention is not limited to following Examples.

Experiments 1 and 2

Component were blended by the composition ratio (unit: part by mass) shown in Tables 1 to 4 to prepare the resin compositions for temporary protection in Examples and Comparative Examples. Each investigation was performed by the presence or absence of a thermally curable component (Experiment 1: without thermally curable component, and Experiment 2: with a thermally curable component). Each component shown in Tables is as follows.

[(Meth)Acrylic Copolymer A-1]

In a flask equipped with a stirrer, a cooler, a gas inlet tube, and a thermometer, 0.04 parts by mass of polyvinyl alcohol and 200 parts by mass of ion-exchanged water were added, and then while stirring, a mixture of 20 parts by mass of methyl methacrylate as a monomer ($\alpha1$), 65 parts by mass of butyl acrylate as a monomer ($\alpha2$), 15 parts by mass of glycidyl methacrylate, 0.4 parts by mass of lauroyl peroxide, and 0.1 parts by mass of O-ethyl-S-(1-phenylethyl) dithiocarbonate as a RAFT agent was added. While introducing nitrogen gas, the liquid temperature was raised, and polymerization was performed at 60° C. for 10 hours and then at 90° C. for 2 hours to obtain resin particles. The resin particles were separated by filtration, washed with ion-exchanged water, and dried at 40° C. for 8 hours using a vacuum dryer to obtain an epoxy group non-uniformly distributed (meth)acrylic copolymer A-1.

(Measurement of Weight Average Molecular Weight)

The weight average molecular weight (standard polystyrene conversion) of A-1 was measured under the conditions of an eluent flow rate of 1 mL/min and a column temperature of 40° C. using HLC-8320 GPC (product name, manufactured by Tosoh Corporation), and the result was $31\times10^4$. Tetrahydrofuran was used as the eluent, and Gelpack GL-A150-S/GL-A160-S manufactured by Hitachi Chemical Co., Ltd. was used as the column.

(Measurement of Glass Transition Temperature)

The glass transition temperature of A-1 was measured using DSC 8230 (product name, manufactured by RIGAKU CO., LTD.) under the conditions of a heating rate of 10° C./min and a measurement temperature of −80 to 80° C., and the result was −14° C. The glass transition temperature in this case is the midpoint glass transition temperature calculated by the method according to JIS K 7121 from calorie change.

[(Meth)Acrylic Copolymer A-2]

In a flask equipped with a stirrer, a cooler, a gas inlet tube, and a thermometer, 0.04 parts by mass of polyvinyl alcohol and 200 parts by mass of ion-exchanged water were added, and then while stirring, a mixture of 20 parts by mass of methyl methacrylate as a monomer ($\alpha1$), 65 parts by mass of butyl acrylate as a monomer ($\alpha2$), 0.4 parts by mass of lauroyl peroxide, and 0.075 parts by mass of n-octyl mercaptan was added. While introducing nitrogen gas, the liquid temperature was raised to 60° C., and 15 parts by mass of glycidyl methacrylate was continuously dropped over 4 hours. Then, the mixture was polymerized at 60° C. for 2 hours and then at 90° C. for 2 hours to obtain resin particles. These resin particles were separated by filtration, washed with ion-exchanged water, and dried at 40° C. for 8 hours using a vacuum dryer to obtain an epoxy group non-uniformly distributed (meth)acrylic copolymer A-2. As a result of measuring the weight average molecular weight and glass transition temperature of A-2 in the same manner as for the above described A-1, they were $30\times10^4$ and −13° C., respectively.

[(Meth)Acrylic Monomer]

A-DPH (product name, manufactured by Shin-Nakamura Chemical Co., Ltd., dipentaerythritol hexaacrylate)

U-10HA (product name, manufactured by Shin-Nakamura Chemical Co., Ltd., urethane acrylate)

U-200PA (product name, manufactured by Shin-Nakamura Chemical Co., Ltd., urethane acrylate)

U-2HA (product name, manufactured by Shin-Nakamura Chemical Co., Ltd., urethane acrylate)

U-6 LPA (product name, manufactured by Shin-Nakamura Chemical Co., Ltd., urethane acrylate)

[Photoradical polymerization initiator]

Irgacure 369 (product name, manufactured by BASF Corp., 2-benzyl-2-dimethylamino-1-(4-morpholinophenyl)-butanone-1)

[Silicone compound]

BYK-UV 3500 (product name, manufactured by BYK Japan K.K., acryloyl group-containing polyether-modified polydimethylsiloxane) SH3773M (product name, manufactured by Dow Corning Toray, Co., Ltd., polyether modified silicone oil).

[Thermally curable component that is liquid at room temperature]

EXA830-CRP (product name, manufactured by DIC Corporation, bisphenol F type epoxy resin, epoxy equivalent: 155-163, liquid at room temperature)

YX-7400 (product name, manufactured by Mitsubishi Chemical Corporation, epoxy resin with specialized function, epoxy equivalent: 440, liquid at room temperature)

TABLE 1

| Experiment | | | Example | | | | | |
|---|---|---|---|---|---|---|---|---|
| 1 | Material | Name | 1-1 | 1-2 | 1-3 | 1-4 | 1-5 | 1-6 |
| Composition (parts by mass) | (Meth)acrylic copolymer | A-1 | 75 | — | 75 | — | — | 86 |
| | | A-2 | — | 75 | — | 86 | 75 | — |
| | (Meth)acrylic monomer | A-DPH | 22 | 22 | — | 11 | 11 | — |
| | | U-10HA | — | — | 22 | — | 11 | 11 |
| | Photoradical polymerization initiator | Irgacure369 | 1 | 1 | 1 | 1 | 1 | 1 |
| | Silicone compound | BYK-UV3500 | 2 | 2 | 2 | 2 | — | 2 |
| | | SH3773M | — | — | — | — | 2 | — |

TABLE 2

| Experiment | | | Comparative Example | | | |
|---|---|---|---|---|---|---|
| 1 | Material | Name | 1-1 | 1-2 | 1-3 | 1-4 |
| Composition (parts by mass) | (Meth)acrylic copolymer | A-1 | 94 | 97 | 75 | 64 |
| | (Meth)acrylic monomer | A-DPH | 3 | — | — | — |
| | | U-200PA | — | — | 22 | — |
| | | U-2HA | — | — | — | 33 |
| | Photoradical polymerization initiator | Irgacure369 | 1 | 1 | 1 | 1 |
| | Silicone compound | BYK-UV3500 | 2 | 2 | 2 | 2 |

TABLE 3

| Experiment 2 | Material | Name | Example 2-1 | 2-2 | 2-3 | 2-4 | 2-5 |
|---|---|---|---|---|---|---|---|
| Composition (parts by mass) | (Meth)acrylic copolymer | A-1 | 67 | — | 67 | 60 | 67 |
| | | A-2 | — | 67 | — | — | — |
| | (Meth)acrylic monomer | U10HA | 20 | 20 | — | — | 10 |
| | | U-6LPA | — | — | 20 | 22 | 10 |
| | Thermally curable component | EXA830-CRP | 10 | — | 5 | 15 | 5 |
| | | YX-7400 | — | 10 | 5 | — | 5 |
| | Photoradical polymerization initiator | Irgacure369 | 1 | 1 | 1 | 1 | 1 |
| | Silicone compound | BYK-UV3500 | 2 | 2 | 2 | 2 | 2 |

TABLE 4

| Experiment 2 | Material | Name | Example 2-6 | Example 2-7 | Comparative Example 2-1 |
|---|---|---|---|---|---|
| Composition (parts by mass) | (Meth)acrylic copolymer | A-1 | 75 | 70 | 64 |
| | (Meth)acrylic monomer | U-10HA | 22 | 22 | — |
| | | U-2HA | — | — | 33 |
| | Thermally curable component | EXA830-CRP | — | 5 | — |
| | Photoradical polymerization initiator | Irgacure369 | 1 | 1 | 1 |
| | Silicone compound | BYK-UV3500 | 2 | 2 | 2 |

Cyclohexanone was further added to the obtained resin composition for temporary protection and the resultant was stirred and mixed. Stirring was performed until each component became uniform, and a varnish of the resin composition for temporary protection was prepared. The prepared varnish was filtered through a 100 mesh filter and vacuum degassed. The varnish after vacuum degassing was applied onto a release-treated polyethylene terephthalate (PET) film with a thickness of 38 µm. The applied varnish was heated and dried in two steps at 90° C. for 5 minutes followed by 5 minutes at 140° C. Thus, a resin film for temporary protection (temporary protective material) having a thickness of 200 µm formed on the substrate PET film was obtained.

<Evaluation of Various Physical Properties>

Various physical properties of the obtained resin film for temporary protection were evaluated. The evaluation results are shown in Tables 5 to 8. The chip size was changed depending on the presence or absence of the thermally curable component; specifically, in Experiment 1 (without thermally curable component), the chip size was 10 mm×10 mm, and in Experiment 2 (with thermally curable component), the chip size was 5 mm×5 mm.

[Elastic Modulus at 25° C. Before and after Photocuring]

The elastic modulus at 25° C. before and after photocuring of the resin film for temporary protection was evaluated by the following method.

The base PET film was peeled off from the resin film for temporary protection (thickness 200 µm) obtained above and then the resin film was cut to obtain a sample having 4 mm width and 30 mm length. This sample was set to the dynamic viscoelasticity device, Rheogel-E4000 (product name, manufactured by UMB Co., Ltd.), and the measurement was performed by applying tensile load at a frequency of 10 Hz and a heating rate of 3° C./minute. The found value at 25° C. was recorded as the elastic modulus before curing. Separately, using a UV-330 HQP-2 exposure machine (product name, manufactured by Oak Manufacturing Co., Ltd.), UV irradiation was performed on the resin film for temporary protection (thickness 200 µm) at an exposure dose of 500 mJ/cm² to cure the resin film for temporary protection. The same test as described above was performed on the cured resin film for temporary protection, and the found value at 25° C. was recorded as the elastic modulus after photocuring.

[Tack Force at 25° C. after Photocuring]

The tack force at 25° C. after photocuring of the resin film for temporary protection was evaluated by the following method.

The base PET film was peeled off from the resin film for temporary protection (thickness 200 µm) obtained above and then the resin film was cut to obtain a sample having 30 mm width and 30 mm length. Using the UV-330 HQP-2 exposure machine (product name, manufactured by Oak Manufacturing Co., Ltd.), UV irradiation was performed on the resin film for temporary protection at an exposure dose of 500 mJ/cm² to photocure the resin film for temporary protection. The tack force of the cured resin film for temporary protection was measured using a tacking tester (manufactured by Lesca Co., Ltd., tacking tester) under the conditions of a pushing speed of 2 mm/sec, a pulling speed 10 mm/sec, a weight at the stop of 8 gf/cm², a time for the stop of 1 sec, and a temperature of 25° C. The tack forces at 5 points were measured and averaged, and the average was recorded as the tack force at 25° C. after photocuring.

[Step Embeddability]

The step embeddability when the resin film for temporary protection was bonded to a workpiece was evaluated by the following method.

Grooves having 40 µm width and 40 µm depth were formed at intervals of 100 µm on the surface of a silicon mirror wafer (6 inches) having 625 µm thickness by blade dicing. The silicon mirror wafer with steps thus formed was placed on the stage of a vacuum laminator LM-50X50-S (product name, NPC Co., Ltd.) with the side having the steps facing up, and the resin film for temporary protection (thickness 200 µm) was placed so as to face the silicon mirror wafer with steps. They were vacuum-laminated under the conditions of an atmospheric pressure of 1.5 hPa, a laminating temperature of 80° C., a laminating pressure of 0.1 MPa, and a holding time of 2 minutes. Thereafter, using an ultrasonic microscope, Insight-300 (product name, manufactured by Insight Co., Ltd.), the state of the step filled with the resin film for temporary protection was observed. Specifically, the image taken with the ultrasonic microscope was subjected to color tone correction and two gradations using image processing software, Adobe Photoshop (registered trademark) to identify void portions. The proportion of void portions (%) was calculated by histogram. This work was performed at five different point to obtain the average value, and the step embeddability was evaluated according to the following criteria:

○: less than 5% of the void proportion
x: 5% or more of the void proportion

[Dicing Property]

The dicing property of the resin film for temporary protection was evaluated by the following method.

A silicon mirror wafer (6 inches) having 625 µm thickness was used as a workpiece, and the resin film for temporary protection (200 μm thickness) obtained above was bonded to the workpiece by roll lamination at 40° C. to obtain a silicon mirror wafer having the resin film for temporary protection. Using the UV-330 HQP-2 exposure machine (product name, manufactured by Oak Manufacturing Co., Ltd.), UV irradiation was performed on the resin film for temporary protection from the resin film side at an exposure dose of 500 mJ/cm². The base PET film was peeled and removed from the resin film for temporary protection, and the resultant was bonded to a dicing tape UC-353EP-110 (product name, manufactured by Furukawa Electric Co., Ltd.), and was subjected to dicing using a fully automatic dicing saw, DFD-6361 (product name, manufactured by Disco Corporation) to obtain a chip. The chip size was 10 mm×10 mm (or 5 mm×5 mm). As the blade, ZH05-SD4000-N1-70-BB (product name, manufactured by Disco Corporation) was used and the conditions were a blade height of 90 μm, a blade rotation speed of 40000 rpm, and a dicing speed of 55 mm/sec. The cut method was single cut.

Regarding burrs, the cross section of the resin film for temporary protection in the chip after dicing was observed using a digital microscope, VHX-S50 (product name, manufactured by Keyence Corporation). The observation was performed at five different points, and the dicing property was evaluated according to the following criteria:

◯: A burr of 5 μm or more was not seen from the cross section; and x: A burr of 5 μm or more was seen from the cross section.

Regarding the delamination, the number of chips present on the dicing tape was visually counted before and after dicing, and evaluated according to the following criteria:

◯: The remaining ratio of chips was 98% or more.

x: The remaining ratio of chips was less than 98%.

[Peelability]

The peelability of the resin film for temporary protection from the workpiece was evaluated by the following method.

The chip of 10 mm×10 mm (or 5 mm×5 mm) prepared in the dicing property evaluation was transported on a polyimide tape which was a heat-resistant adhesive material tape, and was bonded thereto. In order to peel off the workpiece from the cured resin film for temporary protection, the pickup was performed using a die bonder, BESTEM-02 (product name, manufactured by Canon Machinery Co., Ltd.) under the conditions of a collet size of 9 mm, a pin number of 13 pins, and a push-up speed of 20 mm/sec. The pickup was performed for 50 chips. The pick-up success ratio at this time was evaluated as the peelability according to the following criteria:

◯: The pickup success rate at pin height of 300 nm was 98% or more; and x: The pickup success rate at pin height of 300 nm was less than 98%.

[Electromagnetic Shield Formability]

The electromagnetic shielding formability (electromagnetic shielding formability) in a workpiece was evaluated by the following method.

The chip of 10 mm×10 mm (or 5 mm×5 mm) prepared in the dicing property evaluation was transported on the polyimide tape which was a heat-resistant adhesive material tape, and was bonded thereto. In Experiment 2, on the other hand, the step of thermally curing the temporary protective material was carried out by performing heat treatment using an inert oven, DN410I (product name, manufactured by Yamato Scientific Co., Ltd.) at 130° C. for 30 minutes and then at 170° C. for 60 minutes (this thermally curing step was not performed in Experiment 1). Using sputtering system, SDH series (product name, manufactured by ULVAC, Inc.), about 1.8 μm of copper was deposited on the workpiece to form an electromagnetic shielding under conditions of a temperature of 60 to 150° C. and a pressure of $7 \times 10^{-1}$ Pa. Thereafter, as in the case of peelability evaluation, using the die bonder, BESTEM-02 (product name, manufactured by Canon Machinery Co., Ltd.), the workpiece was peeled from the cured resin film for temporary protection to obtain the workpiece in which the electromagnetic shield was formed. The obtained workpiece was observed with a microscope, and the electromagnetic shield formability was evaluated according to the following criteria:

◯: Copper was deposited on the entire surface other than the surface protected by the resin film for temporary protection; and x: Copper was not deposited on the entire surface other than the surface protected by the resin film for temporary protection, or copper was also deposited on the surface protected by the resin film for temporary protection.

TABLE 5

| Experiment 1 | | Example | | | | | |
|---|---|---|---|---|---|---|---|
| | | 1-1 | 1-2 | 1-3 | 1-4 | 1-5 | 1-6 |
| Elastic modulus at 25° C. (MPa) | Before photocuring | 0.3 | 0.3 | 0.3 | 0.5 | 0.3 | 1 |
| | After photocuring | 300 | 300 | 100 | 130 | 170 | 60 |
| Step embeddability | | ◯ | ◯ | ◯ | ◯ | ◯ | ◯ |
| Dicing property (buff) | | ◯ | ◯ | ◯ | ◯ | ◯ | ◯ |
| Peelability | | ◯ | ◯ | ◯ | ◯ | ◯ | ◯ |
| Electromagnetic shield formability | | ◯ | ◯ | ◯ | ◯ | ◯ | ◯ |

TABLE 6

| Experiment 1 | | Comparative Example | | | |
|---|---|---|---|---|---|
| | | 1-1 | 1-2 | 1-3 | 1-4 |
| Elastic modulus at 25° C. (MPa) | Before photocuring | 1.5 | 0.3 | 0.3 | 4 |
| | After photocuring | 20 | 0.3 | 20 | 60 |
| Step embeddability | | ◯ | ◯ | ◯ | x |
| Dicing property (burr) | | x | x | x | x |
| Peelability | | ◯ | ◯ | ◯ | ◯ |
| Electromagnetic shield formability | | x | x | x | x |

TABLE 7

| Experiment 2 | | Example | | | | |
|---|---|---|---|---|---|---|
| | | 2-1 | 2-2 | 2-3 | 2-4 | 2-5 |
| Elastic modulus at 25° C. (MPa) | Before photocuring | 0.3 | 0.3 | 0.3 | 0.3 | 0.3 |
| | After photocuring | 60 | 60 | 80 | 50 | 60 |
| Tack force at 25° C. (N) | After photocuring | 1.6 | 1.6 | 1.6 | 2.2 | 1.2 |
| Step embeddability | | ◯ | ◯ | ◯ | ◯ | ◯ |
| Dicing property | Burr | ◯ | ◯ | ◯ | ◯ | ◯ |
| | Delamination | ◯ | ◯ | ◯ | ◯ | ◯ |
| Peelability | | ◯ | ◯ | ◯ | ◯ | ◯ |
| Electromagnetic shield formability | | ◯ | ◯ | ◯ | ◯ | ◯ |

TABLE 8

| Experiment 2 | | Example 2-6 | Example 2-7 | Comparative Example 2-1 |
|---|---|---|---|---|
| Elastic modulus at 25° C. (MPa) | Before photocuring | 0.3 | 0.3 | 4 |
| | After photocuring | 100 | 100 | 60 |
| Tack force at 25° C. (N) | After photocuring | 0.5 | 0.7 | 0.5 |
| | Step embeddability | ○ | ○ | × |
| Dicing property | Burr | ○ | ○ | ○ |
| | Delamination | × | × | × |
| | Peelability | ○ | ○ | ○ |
| | Electromagnetic shield formability | ○ | ○ | × |

As is clear from the results shown in Tables 5 to 8, it was confirmed that in Examples, an electronic component having an electromagnetic shield in a desired portion was obtained.

REFERENCE SIGNS LIST

1: Base, 2: Convex portion, 10: Workpiece, 20, 20c: Temporary protective material, 30: Base film, 40: Dicing tape, 50: Heat-resistant adhesive material tape, M: Metal film, and C: Colette.

The invention claimed is:

1. A method for manufacturing an electronic component having an electromagnetic shield, the method comprising:
a bonding step of bonding a temporary protective material on a workpiece with unevenness on the surface thereof;
a photocuring step of curing the temporary protective material by light irradiation;
a dicing step of singulating the workpiece and the temporary protective material;
a shielding step of forming a metal film on a portion of the singulated workpiece, the portion having no temporary protective material bonded thereon; and
a peeling step of peeling the temporary protective material from the workpiece having the metal film formed,
wherein the temporary protective material is formed from a resin composition for temporary protection with an elastic modulus at 25° C. of 3 MPa or less and an elastic modulus at 25° C. of 40 MPa or more after light irradiation with an exposure dose of 500 mJ/cm$^2$ or more.

2. The method according to claim 1, wherein the resin composition has a tack force of 1 to 5 N as measured at 25° C. by a probe tack test after light irradiation with an exposure dose of 500 mJ/cm$^2$ or more.

3. The method according to claim 1, wherein the resin composition comprises a (meth)acrylic copolymer (A), and the (meth)acrylic copolymer comprises a (meth)acrylic monomer (α1) and a (meth)acrylic monomer (α2) as copolymer components, a homopolymer of the (meth)acrylic monomer (α1) having a glass transition temperature of 50° C. or more and a homopolymer of the (meth)acrylic monomer (α2) having a glass transition temperature of 0° C. or less.

4. The method according to claim 3, wherein a weight average molecular weight of the (meth)acrylic copolymer (A) is 100000 to 1000000.

5. The method according to claim 1, wherein the resin composition further comprises a (meth)acrylic monomer (B).

6. The method according to claim 1, wherein the resin composition further comprises a photoradical polymerization initiator (C).

7. The method according to claim 1, wherein the resin composition further comprises a silicone compound (D).

8. The method according to claim 1, wherein the resin composition further comprises a thermally curable component (E), and the component (E) is liquid at room temperature.

9. The method according to claim 1, further comprising a thermally curing step of further curing the temporary protective material by heating after the dicing step.

10. The method according to claim 1, wherein the temporary protective material is in the form of a film.

11. A resin composition for temporary protection, the resin composition being for forming the temporary protective material and used for a method for manufacturing an electronic component having an electromagnetic shield, the method comprising:
a bonding step of bonding a temporary protective material on a workpiece with unevenness on the surface thereof;
a photocuring step of curing the temporary protective material by light irradiation;
a dicing step of singulating the workpiece and the temporary protective material;
a shielding step of forming a metal film on a portion of the singulated workpiece, the portion having no temporary protective material bonded thereon; and
the peeling step of peeling the temporary protective material from the workpiece having the metal film formed,
wherein the resin composition has an elastic modulus at 25° C. of 3 MPa or less and an elastic modulus at 25° C. of 40 MPa or more after light irradiation with an exposure dose of 500 mJ/cm$^2$ or more.

12. The resin composition for temporary protection according to claim 11, wherein the resin composition has a tack force of 1 to 5 N as measured at 25° C. by a probe tack test after light irradiation with an exposure dose of 500 mJ/cm$^2$ or more.

13. The resin composition for temporary protection according to claim 11, wherein the resin composition comprises a (meth)acrylic copolymer (A), and the (meth)acrylic copolymer comprises a (meth)acrylic monomer (α1) and a (meth)acrylic monomer (α2) as copolymer components, a homopolymer of the (meth)acrylic monomer (α1) having a glass transition temperature of 50° C. or more and a homopolymer of the (meth)acrylic monomer (α2) having a glass transition temperature of 0° C. or less.

14. The resin composition for temporary protection according to claim 13, wherein a weight average molecular weight of the (meth)acrylic copolymer (A) is 100000 to 1000000.

15. The resin composition for temporary protection according to claim 11, further comprising a (meth)acrylic monomer (B).

16. The resin composition for temporary protection according to claim 11, further comprising a photoradical polymerization initiator (C).

17. The resin composition for temporary protection according to claim 11, further comprising a silicone compound (D).

18. The resin composition for temporary protection according to claim 11, further comprising a thermally curable component (E), wherein the component (E) is liquid at room temperature.

19. The resin composition for temporary protection according to claim 11, wherein the method further comprises a thermally curing step of further curing the temporary protective material by heating after the dicing step.

20. A resin film for temporary protection, obtained by forming the resin composition according to claim 11 into a film.

* * * * *